US011450671B2

(12) United States Patent
Liebmann et al.

(10) Patent No.: US 11,450,671 B2
(45) Date of Patent: Sep. 20, 2022

(54) SEMICONDUCTOR APPARATUS HAVING STACKED DEVICES AND METHOD OF MANUFACTURE THEREOF

(71) Applicant: TOKYO ELECTRON LIMITED, Tokyo (JP)

(72) Inventors: Lars Liebmann, Halfmoon, NY (US); Jeffrey Smith, Clifton Park, NY (US); Anton deVilliers, Clifton Park, NY (US); Daniel Chanemougame, Niskayuna, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 20 days.

(21) Appl. No.: 16/848,366

(22) Filed: Apr. 14, 2020

(65) Prior Publication Data

US 2021/0043630 A1    Feb. 11, 2021

Related U.S. Application Data

(60) Provisional application No. 62/883,865, filed on Aug. 7, 2019.

(51) Int. Cl.
*H01L 27/108* (2006.01)
*H01L 27/092* (2006.01)
*H01L 27/24* (2006.01)

(52) U.S. Cl.
CPC .... *H01L 27/10808* (2013.01); *H01L 27/0928* (2013.01); *H01L 27/2481* (2013.01)

(58) Field of Classification Search
CPC . H01L 27/108; H01L 27/092; H01L 27/0928; H01L 27/0688; H01L 27/10808; H01L 27/2481; H01L 21/823871

(Continued)

(56) References Cited

U.S. PATENT DOCUMENTS 8,446,176 B1 * 5/2013 Yang ..................... H01L 27/092
                                                                326/103
8,513,725 B2    8/2013 Sakuma et al.
(Continued)

FOREIGN PATENT DOCUMENTS

JP          5651415 B2    1/2015

OTHER PUBLICATIONS

International Search Report and Written Opinion dated Oct. 22, 2020 in International Application No. PCT/US2020/039379 filed on Jun. 24, 2020, 12 pages.

*Primary Examiner* — Sheng-Bai Zhu
(74) *Attorney, Agent, or Firm* — Oblon, McClelland, Maier & Neustadt, L.L.P.

(57) ABSTRACT

Aspects of the disclosure provide a semiconductor apparatus including a first stack of transistors and a second stack of transistors. The first stack includes a first transistor and a second transistor stacked on the first transistor along a Z direction perpendicular to a substrate plane. The second stack includes a third transistor and a fourth transistor stacked on the third transistor along the Z direction. The semiconductor apparatus includes a first routing track and a second routing track electrically isolated from the first routing track. The first and second routing tracks extend in an X direction parallel to the substrate plane. A first and fourth conductive trace conductively couple a first gate of the first transistor and a fourth gate of the fourth transistor to the first routing track, respectively. A first terminal structure conductively couples four source/drain terminals of the first, second, third and fourth transistors, respectively.

17 Claims, 10 Drawing Sheets

(58) Field of Classification Search
USPC .......................................................... 257/369
See application file for complete search history.

(56) References Cited

U.S. PATENT DOCUMENTS

| | | | |
|---|---|---|---|
| 8,574,982 B2 | 11/2013 | Erickson et al. | |
| 8,896,054 B2 | 11/2014 | Sakuma et al. | |
| 8,952,431 B2 | 2/2015 | Guo et al. | |
| 8,994,080 B2 | 3/2015 | Guo et al. | |
| 9,343,464 B2 | 5/2016 | Erickson et al. | |
| 9,564,450 B2 | 2/2017 | Sakuma et al. | |
| 9,905,571 B2 | 2/2018 | Sakuma et al. | |
| 10,741,587 B2 | 8/2020 | Tochibayashi et al. | |
| 2006/0220134 A1* | 10/2006 | Huo .................... | H01L 27/1203 257/351 |
| 2011/0204428 A1 | 8/2011 | Erickson et al. | |
| 2012/0068241 A1* | 3/2012 | Sakuma ............ | H01L 27/11551 257/314 |
| 2013/0292755 A1 | 11/2013 | Erickson et al. | |
| 2013/0299894 A1 | 11/2013 | Sakuma et al. | |
| 2014/0332860 A1 | 11/2014 | Guo et al. | |
| 2014/0332862 A1 | 11/2014 | Guo et al. | |
| 2015/0048440 A1 | 2/2015 | Sakuma et al. | |
| 2015/0187764 A1 | 7/2015 | Guo et al. | |
| 2015/0348909 A1* | 12/2015 | Yamazaki ........... | H01L 27/0688 257/775 |
| 2015/0348997 A1* | 12/2015 | Sasagawa ......... | H01L 29/78696 257/43 |
| 2016/0197069 A1* | 7/2016 | Morrow ............ | H01L 21/76897 257/393 |
| 2016/0322353 A1* | 11/2016 | Ikeda ................ | H01L 29/78681 |
| 2017/0125435 A1 | 5/2017 | Sakuma et al. | |
| 2017/0263651 A1 | 9/2017 | Tochibayashi et al. | |
| 2019/0172828 A1 | 6/2019 | Smith et al. | |

\* cited by examiner

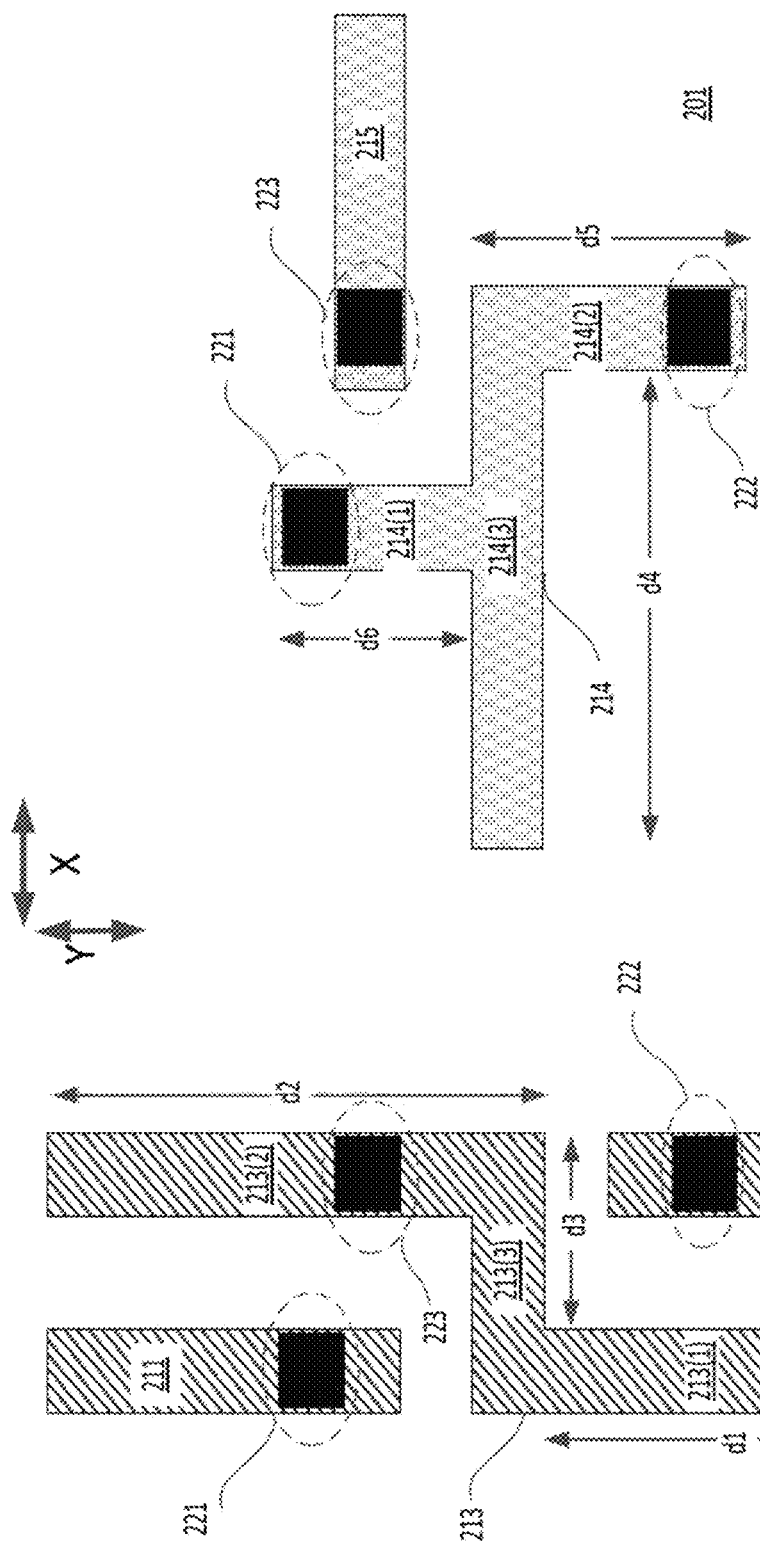

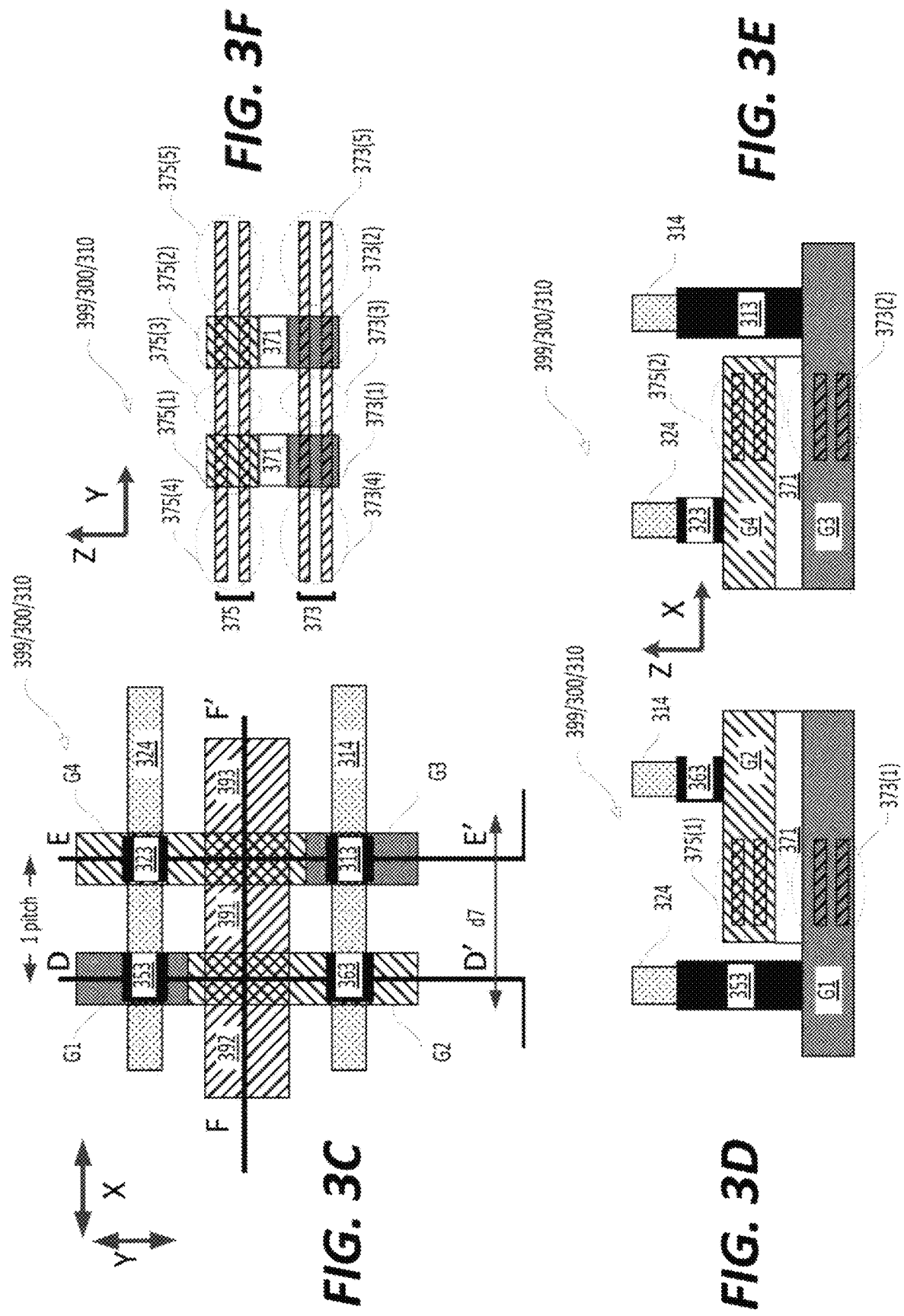

US 11,450,671 B2

SEMICONDUCTOR APPARATUS HAVING STACKED DEVICES AND METHOD OF MANUFACTURE THEREOF

INCORPORATION BY REFERENCE

This present disclosure claims the benefit of U.S. Provisional Application No. 62/883,865, "Two-CPP Cross-Couple for CFET" filed on Aug. 7, 2019, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor devices are widely used in various electronic apparatuses, such as smart phones, computers, and the like. In general, a semiconductor device can include a substrate having active devices such as transistors, capacitors, inductors and other components. There is an ever increasing demand for smaller and faster semiconductor devices which are simultaneously able to support a greater number of increasingly complex and sophisticated functions. This scaling down process generally provides benefits by increasing production efficiency and lowering associated costs. Nevertheless, such scaling down has also increased the complexity of processing and manufacturing of the semiconductor dev ices. As dimensions of semiconductor devices scale to smaller sub-micron sizes in advanced technology nodes, it becomes more challenging to increase the density of semiconductor devices. Improved structures and methods for manufacturing same are desired.

SUMMARY

Aspects of the disclosure provide a semiconductor apparatus. The semiconductor apparatus can include a first stack of transistors including a first transistor formed on a substrate and a second transistor stacked on the first transistor along a Z direction substantially perpendicular to a substrate plane of the substrate. The semiconductor apparatus can include a second stack of transistors including a third transistor formed on the substrate and a fourth transistor stacked on the third transistor along the Z direction. The semiconductor apparatus can include a first routing track and a second routing track electrically isolated from the first routing track where the first and second muting tracks extend in an X direction parallel to the substrate plane. The semiconductor apparatus can include a first conductive trace and a fourth conductive trace configured to conductively couple a first gate of the first transistor and a fourth gate of the fourth transistor to the first routing track, respectively. The semiconductor apparatus can include a second conductive trace and a third conductive trace configured to conductively couple a second gate of the second transistor and a third gate of the third transistor to the second routing track, respectively. Further, the semiconductor apparatus can include a first terminal structure configured to conductively couple four source/drain (S/D) terminals of the first, second, third and fourth transistors, respectively.

In an embodiment, each of the first and second muting tracks is positioned in a plane above the first stack of transistors and the second stack of transistors along the Z direction.

The semiconductor apparatus can further include a second terminal structure configured to conductively couple remaining S/D terminals of the first and second transistors. The semiconductor apparatus can further include a third terminal structure configured to conductively couple remaining S/D terminals of the third and fourth transistors.

The semiconductor apparatus can further include an inverter circuit configured to invert an input signal of the inverter circuit into an output signal of the inverter circuit where the output signal is an inverted signal of the input signal. The inverter circuit can further include a third stack of transistors having a fifth transistor formed on the substrate and a sixth transistor stacked on the fifth transistor along the Z direction. The inverter circuit can include a fifth conductive trace configured to conductively couple a common gate to one of the first and second routing tracks where the common gate includes a fifth gate of the fifth transistor and a sixth gate of the sixth transistor that are conductively coupled to the input signal. The semiconductor apparatus can include a conductive trace configured to conductively couple the input signal to the first routing track and a conductive trace configured to conductively couple the output, signal to the second routing track.

The semiconductor apparatus can include a conductive trace configured to conductively couple a first signal to the first routing track and a conductive trace configured to conductively couple a second signal to the second routing track. The second signal can be an inverted signal of the first signal.

In an example, the second gate of the second transistor is stacked directly above the first gate of the first transistor along the Z direction, and the fourth gate of the fourth transistor is stacked directly above the third gate of the third transistor along the Z direction.

In an example, the first conductive trace bypasses the second gate of the second transistor and the second transistor, and the third conductive trace bypasses the fourth gate of the fourth transistor and the fourth transistor.

In an example, the first and the second transistors are complementary transistors including an n-type transistor and a p-type transistor, and the third and the'fourth transistors are complementary transistors.

In an example, the second gate of the second transistor is stacked on the first gate of the first transistor and the fourth gate of the fourth transistor is stacked on the third gate of the third transistor, the first and second routing tracks are positioned in one or more planes above the first, second, third, and fourth gates along the Z direction, the first and second conductive traces, are spatially separated, the first conductive trace bypasses the second gate of the second transistor and the second transistor, and the second conductive trace bypasses the first gate of the first transistor and the first transistor, the third and fourth conductive trace are spatially separated, the third conductive trace bypasses the fourth gate of the fourth transistor and the fourth transistor, the fourth conductive trace bypasses the third gate of the third transistor and the third transistor, and the fifth conductive trace is conductively coupled to the first routing track. The semiconductor apparatus further includes a conductive trace configured to couple the output signal to the second routing track.

In an example, a second gate area that is a maximum cross sectional area of the second gate intersecting with a plane substantially, perpendicular to the Z direction, is equal to or larger than a first gate area that is a maximum cross sectional area of the first gate intersecting with a plane substantially perpendicular to the Z direction and a fourth gate area that is a maximum cross sectional area of the fourth gate intersecting with a plane substantially perpendicular to the Z direction, is equal to or larger than a third gate area that is a maximum cross sectional area of the third gate intersecting with a plane substantially perpendicular to the Z direction, the second gate is staggered above the first gate, and the fourth gate is staggered above the third gate.

In an example, the second gate area is less than the first gate area, and the fourth gate area is less than the third gate area, the second gate is staggered above the first gate, and the fourth gate is staggered above the third gate.

In an example, the first transistor further includes a first set of semiconductor bars stacked along the Z direction in which the first gate surrounds and is attached to the first set of semiconductor bars, and the second transistor further includes a second set of semiconductor bars stacked along the Z direction in which the second gate surrounds and is attached to the second set of semiconductor bars. In an example, the second set of semiconductor bars is stacked on the first set of semiconductors bars along the Z direction.

In an example, the first gate and the second gate are separated and conductively isolated by a dielectric layer including one or more dielectric materials, and the third gate and the fourth gate are separated and conductively isolated by the dielectric layer.

BRIEF DESCRIPTION OF THE DRAWINGS

Various embodiments of this disclosure that are proposed as examples will be described in detail with reference to the following figures, wherein like numerals reference like elements, and wherein:

FIGS. 2B-2D show top view s of respective portions in the 2D semiconductor apparatus 299 according to embodiments of the present disclosure;

FIG. 3C show a top view of the 3D semiconductor apparatus 399 according to an embodiment of the present disclosure FIG. 3D shows a cross sectional view of the 3D semiconductor apparatus 399 sectioned along DD' FIG. 3C according to an embodiment of the present disclosure;

FIG. 3E shows a cross sectional view of the 3D semiconductor apparatus 399 sectioned along EE' of FIG. 3C according to an embodiment of the present disclosure;

FIG. 3F shows a cross sectional view of the 3D semiconductor apparatus 399 sectioned along FF' of FIG. 3C according to an embodiment of the present disclosure;

DETAILED DESCRIPTION OF EMBODIMENTS

Semiconductor devices, such as transistors, can be stacked along a Z direction that is substantially perpendicular to a substrate plane of a semiconductor apparatus to increase a device density (i.e., a number of semiconductor devices per unit area of the substrate plane) of the semiconductor apparatus. The substrate plane can be a planar working surface of a substrate of the semiconductor apparatus. The semiconductor apparatus can be referred to as a three-dimensional (3D) semiconductor apparatus, and 3D integration can refer to manufacturing processes that can form the 3D semiconductor apparatus.

Figure 1B:
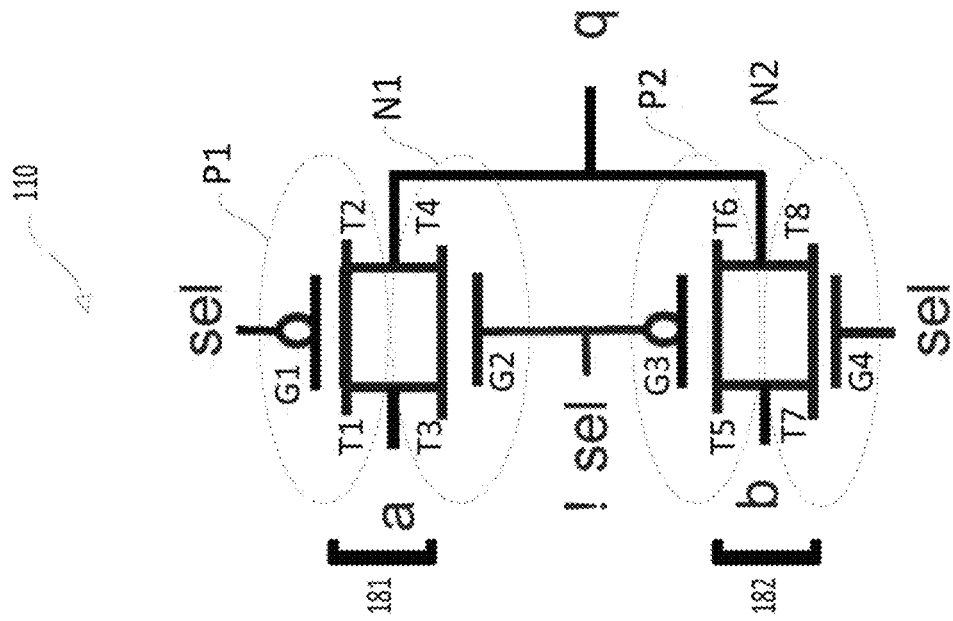
FIG. 1B shows an example of a transmission gate pair 110 according to an embodiment of the present disclosure.
Figure 1A:
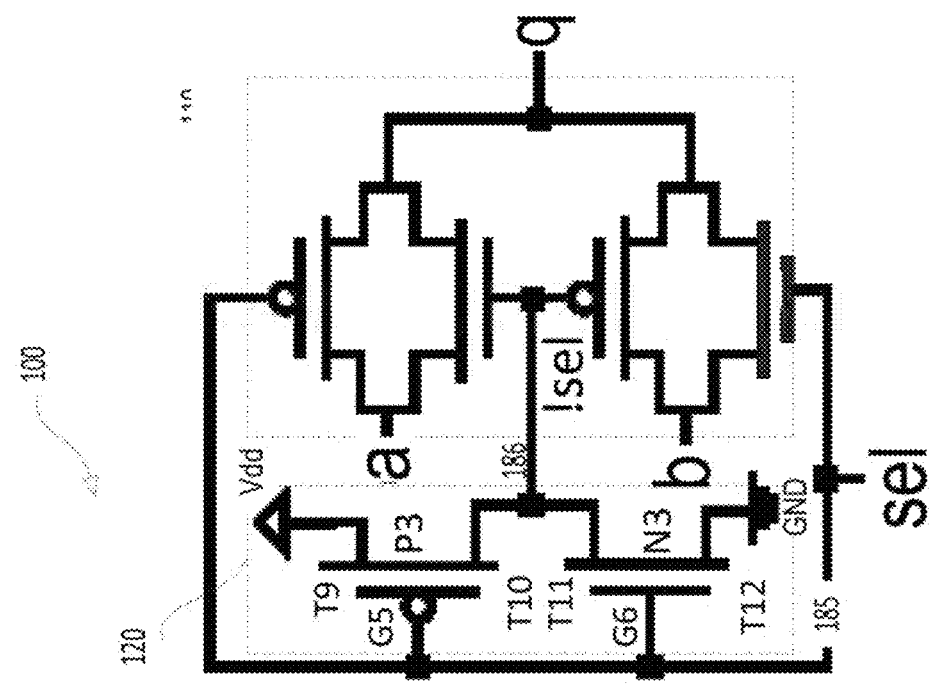
FIG. 1A show a circuit schematic of an exemplary multiplexer (MUX) 100 according to an embodiment of the present disclosure.

FIG. 1A show a circuit schematic of an exemplary multiplexer (MUX) 100 according to an embodiment of the present disclosure. The MUX 100 can include an inverter (or an inverter circuit) 120 and a pair of transmission gates (or a transmission gate pair) 110. The MUX 100 can have input signals 'a' and 'b' an output signal 'q' and a control signal 'sel'. The inverter 120 can invert a control signal 'sel' (or shortened as 'sel') of an input terminal 185 to generate a signal '!sel' (or shortened as '!sel') that is an inverted signal of 'sel'. '!sel' is an output signal of an output terminal 186 of the inverter 120. Depending on 'sel', the output signal 'q' of the MUX 100 can be one of: the input signals 'a' and 'b'. FIG. 1B shows an example of the transmission gate pair 110 according to an embodiment of the present disclosure. The transmission gate pair 110 can further include a first transmission gate 181 having two transistors P1 and N1 connected in parallel and a second transmission gate 182 having two transistors P2 and N2 connected in parallel. The input signals 'a' and 'b' are also input signals of the transmission gate pair 110. The output signal 'q' is also an output signal of the transmission gate pair 110.

Figure 3A:
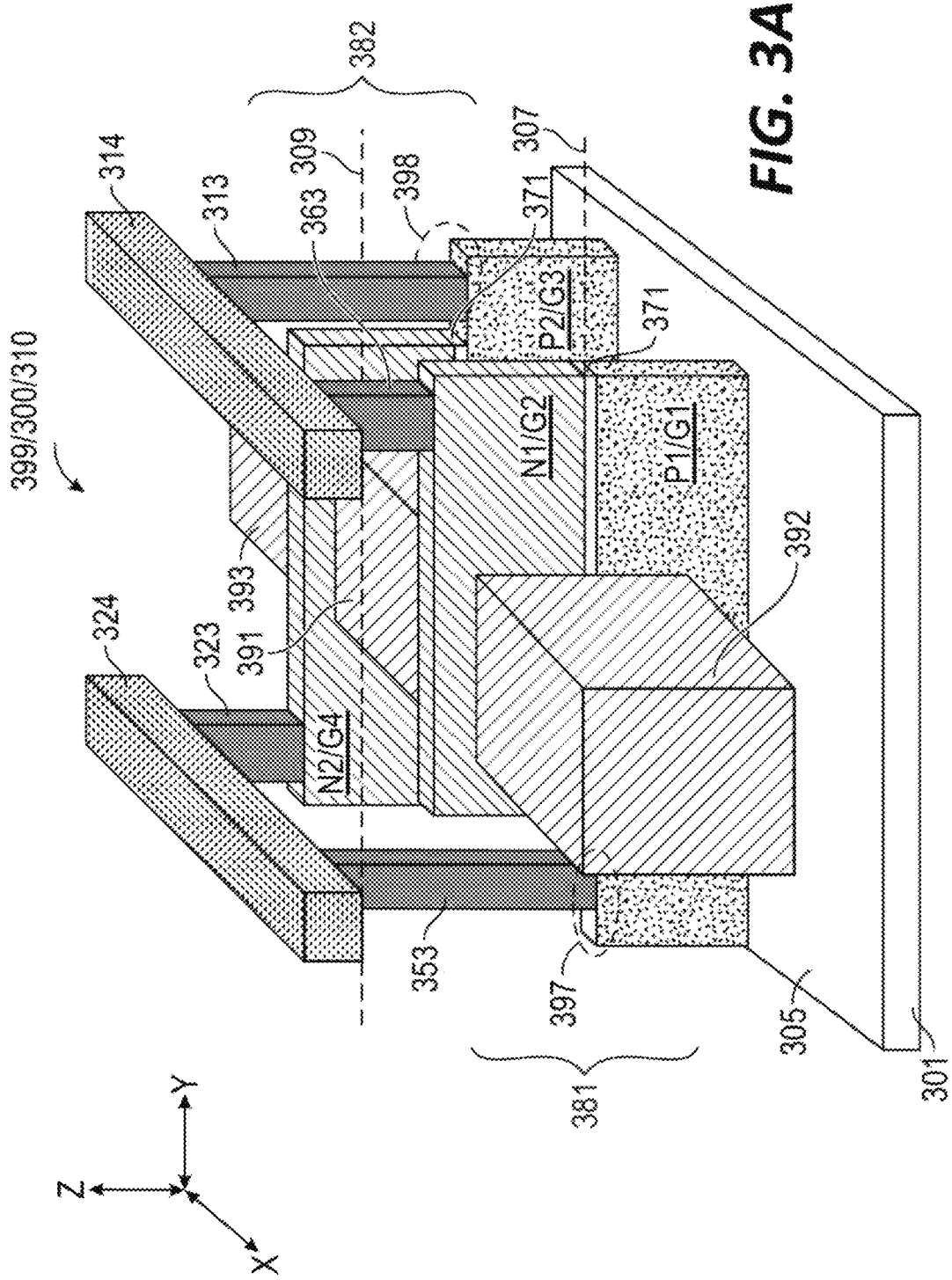
FIGS. 3A-3B show perspective views of a 3D semiconductor apparatus 399 according to embodiments of the present disclosure.

To increase device density and improve performance, 3D integration can be used to form the MUX 100. FIG. 3A show s a 3D semiconductor apparatus 399 including a MUX 300 that has a transmission gate pair 310 according to an embodiment of the present disclosure. The MUX 300 and the transmission gate pair 310 are 3D implementations of the MUX 100 and the transmission gate pair 110, respectively. Referring to FIGS. 1B and 3A, the transmission gate pair 310 includes a first stack of transistors 381 having P1 formed on a substrate 301 of the 3D semiconductor apparatus 399 and N1 stacked on P1 along a Z direction substantially perpendicular to a substrate plane 305 of the substrate 301. In an example, P1 is formed on the substrate plane 305, and N1 is formed on a plane 307 that is parallel to the substrate plane 305. P1 includes a gate G1, and N1 includes a gate G2. The transmission gate pair 310 includes a second stack of transistors 382 having P2 formed on the substrate 301 and N2 stacked on P2 along the Z direction. In an example, P2 is formed on the substrate plane 305, and N2 is formed on the plane 307. P2 includes a gate G3, and N2 includes a gate G4.

Referring to FIGS. 1A, 1B, and 3A, the first stack 381 implements the first transmission gate 181, and the second stack 382 implements the second transmission gate 182. Since the gates G1-G2 of the first stack 381 are controlled by different signals (e.g., 'sel' and '!sel'), the gates G1-G2 can be split gates. Similarly, the gates G3-G4 can be split gates. Split gates can refer to a stack of gates separated physically and electrically, and can be conductively connected to separate routing tracks via separate conductive traces. The split gates can have independent connections, for example, to be connected to different electrical signals.

A first conductive trace 353 and a fourth conductive trace 323 can be configured to conductively couple the gates G1 and G4 to a first routing track 324, respectively. A second conductive trace 363 and a third conductive trace 313 can be configured to conductively couple the gates G2 and G3 to a second routing track 314, respectively. Accordingly, the first routing track 324 and the second routing track 314 that is electrically isolated from the first routing track 324 can be formed to provide different signals 'sel' and '!sel' respectively. In an example, the split gates G1-G2 are coupled to 'sel' and '!sel' via the first and second conductive traces 353 and 363, respectively, and G3-G4 are coupled to '!sel' and 'sel' via the third and fourth conductive traces 313 and 323, respectively.

In an example, P1 and P2 are p-type transistors, such as p-type field effect transistors (pFETs), and N1 and N2 are n-type transistors, such as n-type FETs (nFETs). Gates (e.g., G1 and G4) of a pFET (e.g., P1) and an nFET (e.g., N2) can be formed in different planes (e.g., G1 on the substrate plane 305 and G4 on the plane 307), and share or access a same routing track (e.g., the first routing track 324), and thus alleviating the need for additional metallization, such as nFET to pFFT crossing required in some planar complementary FETs (CFETs) and reducing routing congestion. Further, referring to FIG. 3A, the first and second routing tracks 324 and 314 are substantially parallel along an X direction (or extend in the X direction) that is perpendicular to the Z direction, and thus the first and second routing tracks 324 and 314 have a unidirectional shape (e.g., a shape formed along a single direction, such as the X direction). The X direction is parallel to the substrate plane 305. The nFET to pFET crossing shown in FIG. 3A can be created efficiently with a single level of unidirectional metallization.

The first and second routing tracks 324 and 314 can be conductively coupled to 'sel' and '!sel', respectively. 'sel' and '!sel' can be at an opposite logic-level to each other. The first and second routing tracks 324 and 314 can be positioned on any suitable routing plane(s). In an example, the first and second routing tracks 324 and 314 can be positioned in a plane 309 that is stacked above the first stack 381 and the second stack 382 along the Z direction.

Referring to FIG. 1B and FIG. 3A, in an example, a first terminal structure 391 can conductively couple four source/drain (S/D) terminals T2, T4, T6, and T8 of the transistors P1, N1, P2, and N2, respectively to provide the output signal 'q'. A second terminal structure 392 can conductively couple remaining S/D terminals T1 and T3 of P1 and N1, respectively. A third terminal structure 393 can conductively couple remaining S/D terminals T5 and T7 of P2 and N2, respectively. The first, second, and third terminal structures 391-393 can include any suitable conductive materials. The 3D semiconductor apparatus 399 can further include additional components, such as conductive traces to couple the first, second, and third terminal structures 391-393 to the signals 'q', 'a', and 'b', respectively.

The present disclosure relates to the design and microfabrication of semiconductor devices and apparatuses.

In the manufacture of a semiconductor apparatus (e.g., on a microscopic scale), various fabrication processes can be implemented. The fabrication processes can include film-forming depositions, etch mask creation, patterning, material etching and removal, doping treatments, and/or the like. The fabrication processes can be performed repeatedly to form desired semiconductor device elements or components on a substrate of the semiconductor apparatus. In some embodiments, with microfabrication, semiconductor device (e.g., transistors) can be created in one plane (e.g., an active device plane), with wiring/metallization formed above the active device plane, and thus can be characterized as two-dimensional (2D) circuits or 2D semiconductor apparatuses fabricated with 2D fabrication (or 2D integration). Scaling efforts can increase a device density (e.g., a number of transistors per unit area in 2D circuits), yet scaling efforts face challenges as scaling enters single digit nanometer semiconductor device fabrication nodes. In an example, 3D semiconductor circuits in which transistors are stacked on top of each other are used to increase a device density.

As described above, 3D integration, e.g., vertically stacking multiple semiconductor devices can overcome certain scaling limitations experienced in planar devices by increasing a device density (e.g., a transistor density when multiple transistors are stacked vertically) in volume rather than area of a semiconductor apparatus. Vertically stacking multiple semiconductor devices has been successfully demonstrated and implemented by the flash memory industry with the adoption of 3D NAND. In various cases, implementing 3D integration in random logic designs can be challenging.

Embodiments in the present disclosure can provide a 3D semiconductor apparatus (e.g., the 3D semiconductor apparatus 399) for a compact transmission gate pair (e.g., the transmission gate pair 310) for dense CFET logic layouts. The compact transmission gate pair can include split gates (e.g., G1-G2) and can be manufactured by a split-gate process flow.

An order of description of different embodiments or steps in the present disclosure is presented for clarity sake. In general, the embodiments or steps can be performed in any suitable order. Additionally, although each of the embodiments, such as different features, techniques, configurations, and/or the like may be described in different places of the present disclosure, it is intended that each of the embodiments can be executed independently of each other or in combination with each other. Accordingly, the present disclosure can be embodied and viewed in many different ways.

In some embodiments, various combinatorial logic functions in complementary metal-oxide semiconductor (CMOS) designs are formed by complementary sets of n-type and p-type transistor pairs in which a single gate connection or a common gate can control (e.g., switch) both n-type and p-type channels in a logic cell. In some examples, a transmission gate pair, for example, formed by a pair of cross-coupled inverters, is a valuable design construct used to efficiently render logic cells such as a MLA, exclusive or (XOR), a latch, and the like. In some design examples split gates are used instead of a common gate in a transmission gate pair.

Referring back to FIG. 1A, in an example, the MUX 100 can be based on a CMOS design and can include the transmission, gate pair 110. The inverter 120 can include transistors P3 (e.g., a pFET) and N3 (e.g., an nFET). P3 includes a gate G5, a source terminal T9 and a drain terminal 110. N3 includes a gate G6, a source terminal T11, and a drain terminal T12. The gates G5 and G6 can be connected to 'sel'. The terminals T10 and T11 can be coupled together and ouput '!sel'.

The transmission gate pair 110 can be formed by a pair of cross-coupled inverters, and thus the transmission gate pair 110 can be referred to as a cross-couple (XC). FIG. 1B shows an enlarged view of the transmission gate pair 110 (or the XC 110). As described above, the XC 110 includes the first transmission gate 181 (also referred to as the first pass gate) and the second transmission gate 182 (also referred to as the second pass gate). In an example, P1 and N1 in the first pass gate 181 can be a pair of CA and P2 and N2 in the second pass gate 182 can be a pair of CFETs, in an example, a pair of CFETs (e.g., P1 and N2) is coupled to 'sel', and another pair of CFETs (e.g., P2 and N1) is coupled to '!sel', In an example, P1 is a pFET including G1 and the S/D terminals T1-T2; N1 is an nFET including G2 and the S/D terminals T3-T4; P2 is a pFET including G3 and the S/D terminals T5-T6; and N2 is an nFET including G4 and the S/D terminals T7-T8. Each of the S/D terminals T1-T8 can be a source terminal or a drain terminal. In an example, when a voltage at T1 is higher than that of T2, T1 is a source terminal of P1 and T2 is a drain terminal of P1. Alternatively, when the voltage at T1 is lower than that of T2, T1 is a drain terminal of P1 and T2 is a source terminal of P1. Similar description can be applied to T3-T8.

In an example, when 'set' is a logic 1, '!sel' is a logic 0. P1 and N1 can function as 'open switches', and thus the first pass, gate 181 functions as an 'open switch', Accordingly, the first pass gate 181 does not pass the input signal 'a' to the output signal 'q'. Meanwhile, P2 and N2 can function as 'closed switches', and thus the'second pass gate 182 functions as a 'closed switch'. Accordingly, the second pass gate 182 can pass the input signal to the output signal 'q'. The output signal 'q' can have a same logic-level as that of the input signal 'b'.

The above descriptions can be suitably adapted when 'sel' is a logic 0 where the first pass gate 181 can pass the input signal 'a' to the output signal 'q' and the second pass gate 182 does not pass the input signal to the output signal 'q'. The output signal 'q' can have a same logic-level: as that of the input signal 'a'.

The XC 110 can have two signal paths, i.e., a first signal path and a second signal path corresponding to the first and second pass gates 181-182, respectively. 'sel' (also referred to as a gate input) can control (e.g., switch) the gate G1 in the first signal path while simultaneously controlling (e.g., switching) the gate G4 in the second signal path. Similarly, '!sel' can control (e.g., switch) the gate G2 in the first signal path while simultaneously controlling (e.g., switching) the gate G3 in the second signal path. In an example, the gate G1 controls a pFET (e.g., P1), and the gate G4 controls an nFET (e.g., N2) that is complementary to P1. Similarly, the gate G2 controls an nFET (e.g., N1), and the gate G3 controls a pFET (e.g., P2) that is complementary to N1.

Figure 2A:
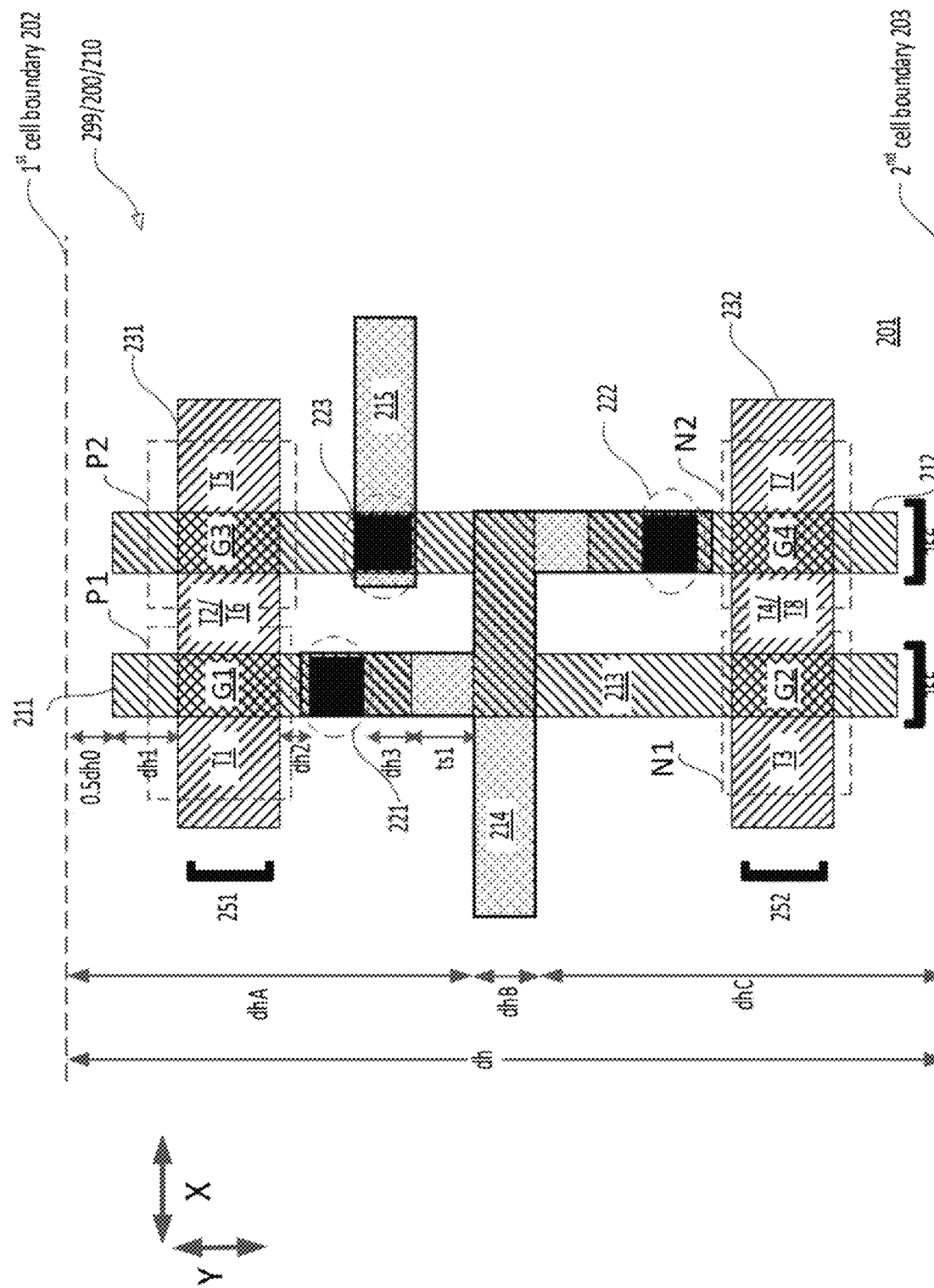
FIG. 2A shows a top view of a 2D semiconductor apparatus 299 according to an embodiment of the present disclosure.

The XC 110 can be formed using any suitable manufacturing processes and/or designs, such as in a 2D semiconductor apparatus 299 in FIGS. 2A-2O using 2D manufacturing processes or 2D fabrication or in the 3D semiconductor apparatus 399 in FIGS. 3A-3I using 3D manufacturing processes or 3D integration.

FIG. 2A shows a top view of the 2D semiconductor apparatus 299 that can be used in certain technology nodes. The 2D semiconductor apparatus 299 includes a MUX 200 having a XC 210 where the MUX 200 and the XC 210 are 2D implementations of the MUX 100 and XC 110, respectively. The MUX 200 can further include an inverter (e.g., a 2D implementation of the inverter 120). Referring to FIG. 2A, as described above, P1 includes G1 and the terminals T1-T2; N1 includes G2 and the terminals T3-T4; P2 includes G3 and the terminals T5-T6; and N2 includes G4 and the terminals T7-T8. P1 and P2 are positioned in a row 251 of a substrate plane 201 of the 2D semiconductor apparatus 299, and the S/D terminals T1, T2, T5 and T6 for P1 and P2 can be formed in a region 231. The region 231 can be doped by a diffusion process, an implantation process, and/or the like. Further, the terminals T2 and T6 are adjacent to each other and conductively coupled. N1 and N2 are positioned in a row 252 of the substrate plane 201, and the S/D terminals T3, T4, T7 and T8 for N1 and N2 can be formed by diffusion into a region 232. The region 232 can be doped by a diffusion process, an implantation process, and/or the like. Further, the terminals T4 and T8 are adjacent to each other and conductively coupled.

Figure 2D:
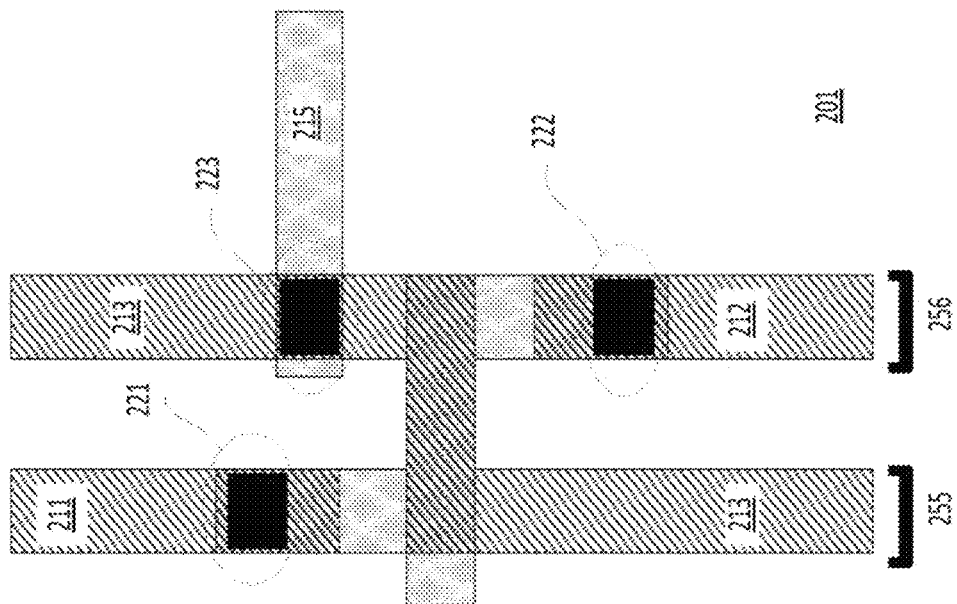
Figure 2D:
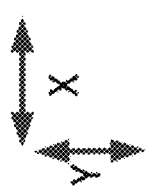

Each of the gates G1-G4 can include one or more structures, such as a dielectric structure and a conductive structure. The conductive structure can include one or more conductive materials, such as polysilicon, copper (Cu), ruthenium (Ru), and/or the like. FIGS. 2B-2D show exemplary layouts of the gates G1-G4 and additional metallization to (e.g., conductive structures 214-215) coupling the gates G1-G4 to signals, such as 'sel' and '!sel' according to embodiments of the present disclosure. FIG. 2B shows a lop view of the gates G1-G4 according to an embodiment of the present disclosure. FIG. 2C shows a top view of the conductive structures 214-215 according to an embodiment of the present disclosure. FIG. 2D shows a top view of the gates G1-G4 and the conductive structures 214-215 according to an embodiment of the present disclosure. The gate G1 includes a conductive structure 211, the gate G2 includes a portion 213(1) of a conductive structure 213, the gate G3 includes a portion 213(2) of the conductive structure 213, and the gate G4 includes a conductive structure 212. The conductive structures 211-213 can be formed using polysilicon.

In some examples, a unidirectional structure refers to a structure that is formed substantially along a single direction (e.g., the X direction, the Y direction, or the like) in a plane parallel to a substrate plane (e.g., the substrate plane 201). A bidirectional structure can refer to a structure where one portion and another portion of the structure are formed along two different directions (e.g., the X and Y directions) in a plane parallel to the substrate plane (e.g., the substrate plane 201). A unidirectional structure can have a unidirectional shape, and a bidirectional structure can have a bidirectional shape.

Referring to FIGS. 2B-2D, to conductively couple C1 (e.g., a gate of a pFET P1 in the first pass gate 181) and G4 (e.g., a gate of an nFET N2 the second pass gate 182) together, an nFET to pFET crossing is implemented using a bidirectional structure (e.g., the conductive structure 214 including portions 214(1)-(2) along the X direction and a portion 214(3) along the Y direction). Thus, the conductive structure 214 can also be referred to as the bidirectional structure 214. The bidirectional structure 214 is used because G1 and G4 are positioned in different rows (e.g., the rows 251-252) and different columns 255-256 of the substrate plane 201, respectively, Referring to FIG. 3A, the nFET to pFET crossing can be created efficiently with the first routing track 324 having the unidirectional shape, and thus alleviating the need for the bidirectional structure 214. The portion 214(1) can conductively couple G1 (e.g., using the conductive structure 211) via a conductive trace 221. The portion 214(2) can conductively couple G4 (e.g., using the conductive structure 212) via a conductive trace 222. The portion 214(3) along the X direction connects the portions 214(1)-(2) along the Y direction. Further, the conductive structure 214 can be conductively coupled to 'sel'.

Similarly, to conductively couple G2 (e.g., a gate of an nFET N1 in the first pass gate 181) and G3 (e.g., a gate of a pFET P2 in the second pass gate 182) together, an nFET to pFET crossing is implemented using a bidirectional structure (e.g., the conductive structure 213). Thus, the conductive structure 213 can also be referred to as the bidirectional structure 213. The conductive structure 213 can be coupled to the conductive structure 215 via a conductive trace 223. Further, the conductive structure 215 can be conductively coupled to '!sel'. The conductive structures 214-215 can be formed using one or more conductive materials, such as Cu, Ru, and/or the like. The conductive structures 214-215 can be formed on one or more planes that are different from a plane (e.g., the substrate plane 201) where the conductive structures 211-213 are formed.

As shown in FIGS. 2A-2D, the XC 210 includes 4 transistors positioned on a same plane (e.g., the substrate plane 201). The layout used in the XC 210 can be rather complex, for example, the XC 210 includes the bidirectional structures 213-214. Referring to FIG. 2A, in some exam*, a dimension 'dh' along the Y direction needs to be large in order to have enough spacing between adjacent structures, and to accommodate tip-to-tip (e.g., a distance dh0 between adjacent cells along the Y direction), tip-to-side (e.g., a tip-to-side distance ts1), contact enclosure, and/or the like design rules needed for forming the XC 210. In an example, dh determines a smallest cell height of a cell where XC 210 can be placed. For example, the cell is positioned between a first cell boundary 202 and a second cell boundary 203. Referring to the columns 255-256, dh includes three sections (e.g., dhA, dhB, and dhC) where dhA along the column 255 and dhC along the column 256 can traverse symmetrical structures and can be equal. Thus, the descriptions below describes dhA and dhB. Referring to the column 255, dhA includes 0.5 dh0 (i.e., half of the tip-to-tip distance dh0), a gate-past-active channel extension (also referred to as 'endcap') dh1, a gate width of the gate G1, a contact to active channel space dh2, a contact width of the conductive structure 211, a poly past contact extension dh3 (also referred to as an enclosure), the tip-to-side distance ts1 (e.g., a distance between the conductive structure 211 and the bidirectional structure 214). dhB corresponds to a width of the bidirectional structure 214. For example, the adjacent structures include the conductive structures 214-215. The adjacent structures can also include the region 231 and the conductive structure 215. For example, to form the XC 210, the bidirectional structure 213 (e.g., a horizontal jog structure formed with polysilicon) can be used to tie two transistors (e.g., N1 and P2) to a common input (e.g., '!sel' of the XC 210 while the bidirectional structure 214 (e.g., a complemented jogged metal line) contacted the second set of transistors (e.g., P1 and N2). In some examples, certain design can have restrictions for a layout to use unidirectional shapes and oi a space is constrained along the Y direction where a dimension of a logic cell along the Y direction is constrained to be small, and thus the XC 210 shown in FIGS. 2A-2D can be difficult to form or the XC 210 can result in density and performance loss for the 2D semiconductor apparatus 299.

Embodiments, such as designs and methods, in the present disclosure can provide benefits to dense layouts in advanced technology nodes. In an example, an area of a cell or a device, such as a logic cell, a MUX, a XC, or the like, can be represented by a number of tracks (or metal tracks) in the cell or the device, referred to as a cell height along the Y direction.

The embodiments in the present disclosure can provide a structure for a XC, such as the XC 310, formed with a CFET technology that can be rendered in cells (e.g., logic cells) as small as 5 tracks (5T). In an embodiment, the XC 310 has a width of 2 pitches and can optimally utilize "split gate" technology to design the XC, for example, using only two routing tracks (e.g., the first routing track 324 and the second routing track 314) and leaving space for other connections in the cell. Referring to FIG. 3C, one pitch can refer to a distance from a first center (e.g., marked by DD') of a conductive structure (e.g., G1) to a second center (e.g., marked by EE') of an adjacent conductive structure (e.g., G3). In some examples, the conductive structure and the adjacent conductive structure are formed using polysilicon, and thus tire distance or the pitch can be referred to as 'a poly pitch' . . . Additional contacts (e.g., a source/drain contact for the first terminal structure 391) can be included in the XC 310, such as between the poly pitch. In an example, the poly pitch (e.g., between DD' and EE') is wide enough to accommodate the gates (e.g., G1 and G4) and the source/drain contact for the first terminal structure 391. Thus, the poly pitch can also be referred to as a 'contacted poly pitch (or cpp). Thus, the XC can have the width of 2 cpp.

Figure 3B:
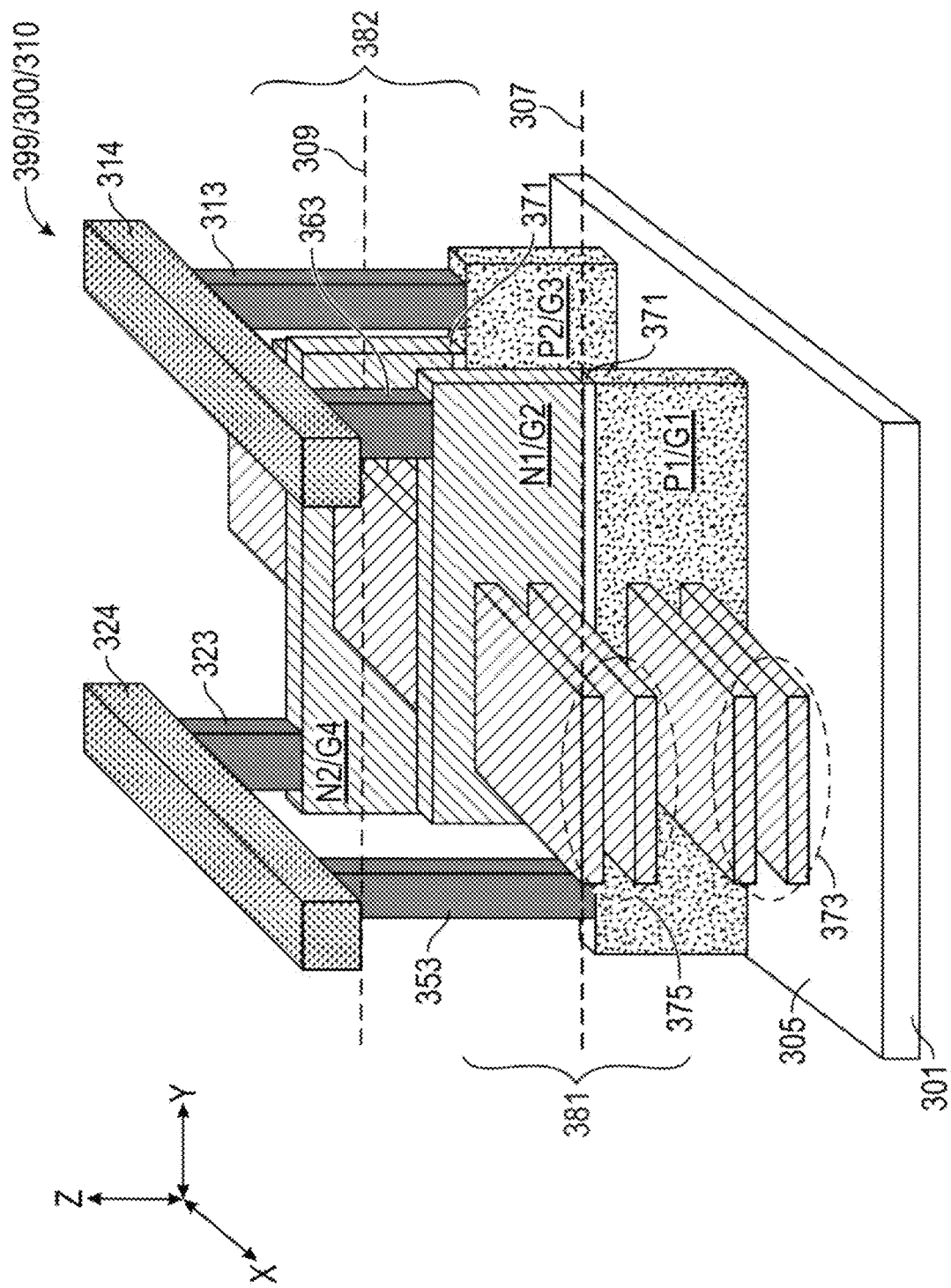

The embodiments include, a compact and resource efficient XC, such as the XC 310, fir CFET-based logic designs. FIGS. 3A-3C show two perspective views and a top view of the 3D semiconductor apparatus 399, respectively, according to embodiments of the present disclosure. FIG. 3D shows a cross sectional view of the 3D semiconductor apparatus 399 sectioned along DD' of FIG. 3C. FIG. 3E shows a cross sectional view of the 3D semiconductor apparatus 399 sectioned along EE' of FIG. 3C. FIG. 3F shows a cross sectional view of the 3D semiconductor apparatus 399 sectioned along FF' of FIG. 3C. As used herein, a semiconductor apparatus, such as the 3D semiconductor apparatus 399, can include transistors (e.g., field-effect transistors and floating-gate transistors), integrated circuits, a semiconductor chip (e.g., memory chip including a 3D NAND memory device, a logic chip on a semiconductor die), a stack of semiconductor chips, a semiconductor package, a semiconductor wafer, and/or the like.

Referring to FIG. 3A, designs herein take advantage of the ability of either n-type or p-type transistors in split-Rate CFET devices to be extended "north" (e.g. towards a 3D power rail that can supply a positive voltage to the 3D semiconductor apparatus 399) or "south" (e.g., towards a VSS power rail) along the Y direction. In an, example, power rail(s) can be formed along the X direction. The power rails can be formed on any suitable planes. The power rail(s) can be above or below the first and second stacks 381-382.

In some examples, such as shown in FIG. 3A, the XC 310 includes the first stack of transistors 381 (e.g., P1 and N1). In a non-limiting example, P1 is a pFET and N1 is an nFET, and G1 of P1 and G2 of N1 are split gates. P1 is the lower transistor and N1 is the upper transistor, and a portion 397 at a first end of G1 is exposed (e.g., not covered by N1 and G2) such that the first routing track 324 can be connected to G1 via the first conductive trace 353 at the portion 397. For a neighboring transistor pair (e.g., P2 and N2), a portion 398 at a second end of G3 of the lower-transistor (P2) is exposed (e.g., not covered by N2 and G4) such that the second routing track 314 can be connected to 63 via the third conductive trace 313 at the portion 398. The exposure of the lower gates (e.g., G1 and G3) can be achieved by any suitable manufacturing processes such as a variety of line-end cut approaches or different direct patterning solutions. The XC 310 can include the first and second routing tracks 324 and 314 (e.g., a pair of unidirectional conductive wires) with one delivering the control signal (in a non-limiting example, 'sel') and the other delivering the inverted signal (e.g., '!sel') to the respective sets of neighboring transistor pairs.

The split gates G1-G2 can be separated and conductively isolated by a dielectric layer 371 including one or more dielectric materials, and the split gates G3-G4 can be separated and conductively isolated by the dielectric layer 371. Alternatively, the split gates G3-G4 can be separated and conductively isolated by a dielectric layer that is different from the dielectric layer 371.

As described above, split gate approaches can selectively expose and contact a bottom transistor (e.g., P1 or P2) or a bottom gate (e.g., G1 or G3), and thus can allow a single unidirectional metal line (e.g., the first routing track 324) to conductively couple with the gate G1 of a p-type transistor (i.e., P1) via the first conductive trace 353 while conductively coupling with the gate G4 of an n-type transistor (i.e., N2) of the neighboring second stack 382 via the fourth conductive trace 323.

In an example, FIG. 3A shows the XC 310 using CFETs and occupying 2 cpp width along the X direction and compact enough to fit into a 5T cell height along the Y direction. As described above, the first conductive trace 353 and the fourth conductive trace 323 can be configured to conductively couple the gates G1 and G4 to the first routing track 324, respectively. The second conductive trace 363 and the third conductive trace 313 can be configured to conductively couple the gates G2 and G3 to the second routing track 314, respectively. Referring to FIG. 3A, the split gates G1 and G2 can be staggered or shifted, for example, along the Y direction. Accordingly, the portion 397 (e.g., at the first end of G1) of the lower gate G1 can be exposed so that the first conductive trace 353 can access G1 and bypass the upper gate G2 and the upper transistor N1. A location of the portion 397 can be at any suitable location of G1 where the suitable location allows the first conductive trace 353 to bypass N1 and G2. Similarly, a location of the portion 398 can be at any suitable location of G3 where the suitable location allows the third conductive trace 313 to bypass N2 and G4.

A cross sectional area of a gate, such as G1, can be a largest cross sectional area (or a maximum cross sectional area) when the gate is sliced with planes parallel to the substrate plane 305. Thus, the cross sectional area of the gate refers to a maximum cross sectional area of the gate intersecting with a plane substantially perpendicular to the Z direction. In general, cross sectional areas of the pair of split gates G1-G2 can have any suitable relationship. In an example, such as shown in FIGS. 3A, 3C, and 3D, the cross sectional area of G1 is larger than that of G2. The cross sectional area of G1 can also be equal to or small than that of G2, and the split gates G1-G2 can be staggered. Cross sectional areas of the split gates G3-G4 can have any suitable relationship. In an example, such as shown in FIGS. 3A, 3C and 3E, the cross sectional area of G3 is larger than that of G4. The cross sectional area of G3 can also be equal to or small than that of G4. Similarly, the split gates G3-G4 can be staggered.

In an example, such as shown in FIG. 3A, the first and second conductive traces 353 and 363 are spatially separated, the first conductive trace 353 bypasses G2 and N1, and the second conductive trace 363 bypasses G1 and P1, the third and fourth conductive trace 313 and 323 are spatially separated, the third conductive trace 313 bypasses G4 and N2, the fourth conductive trace 323 bypasses G3 and P2.

Referring to FIGS. 3A, 3B, and 3D-3F, the dielectric layer 371 can be sandwiched between the split gates G1-G2, and the dielectric layer 371 can also be sandwiched between the split gates G3-G4.

The split gates G1-G2 can have any suitable spatial relationship within a plane that is parallel to the substrate plane 305. For example, G2 can be shifted from G1 along the X direction, the V direction, and/or any direction that is parallel to the substrate plane 305. The above description is also applicable to the split gates G3-G4. Referring to FIGS. 3A-3H, in an example, G2 can be stacked directly above G1 along the Z direction, for example, to maximize an overlapped area between the split gates G1-G2. Similarly, G4 can be stacked directly above G3 along the Z direction.

Referring to FIGS. 3B and 3D-3F, the XC 310 can further include a first channel structure 373 and a second channel structure 375. The first and second channel structures 373 and 375 can be surrounded by the first, second, and third terminal structures 391-393. To better reveal the first and second channel structures 373 and 375, the first, second, and third terminal structures 391-393 at not shown in FIGS. 3B and 3D-3F. The first channel structure 373 can include a portion 373(1) and a portion 373(2), for example, surrounded by the gates G1 and G3, respectively. The second channel structure 375 can include a portion 375(1) and a portion 375(2), for example, surrounded by the gates G2 and G4, respectively. The first channel structure 373 and the second channel structure 375 can have any suitable structure (including shapes and dimensions) and material systems such that the portion 373(1) can provide a semiconductor channel, such as a p-channel, when P1 is in operation; the portion 373(2) can provide a semiconductor channel, such as a p-channel, when P2 is in operation; the portion 375(1) can provide a semiconductor channel, such as an n-channel, when N1 is in operation; and the portion 375(2) can provide a semiconductor channel, such as an n-channel, when N2 is in operation.

Referring to FIGS. 3D-3F, the first channel structure 373 includes a first set of semiconductor bars (e.g., 2 semiconductor bars) stacked along the Z direction, and the second channel structure 375 includes a second set of semiconductor bars (e.g., 2 semiconductor bars) stacked along the Z direction. In another word, P1 can include the portion 373(1) (also a portion of the first set of semiconductor bars) that is surrounded by and attached to G1, N1 can include the portion 375(1) (also a portion of the second set of semiconductor bars) that is surrounded by, and attached to G2. P2 can include the portion 373(2) (also a portion of the first set of semiconductor bars) that is surrounded by and attached to G3, N2 can include the portion 375(2) (also a portion of the second set of semiconductor bars) that is surrounded by and attached to G4. In an example, the second channel structure 375 is stacked above the first channel structure 373 along the Z direction and the second set of semiconductor bars is stacked on the first set of semiconductors bars along the Z direction. Referring to FIGS. 3D-3F, the portion 375(1) is stacked over the portion 373(1) along the Z direction, and the portion 375(2) is stacked over the portion 375(2) along the Z direction.

A gate (e.g., G1, G2, G3, or G4) can cover or surround a respective channel structure (e.g., a portion of 373 or a portion of 375) in any suitable configuration, such as that used in Fin FET (FinFET), Gate All Around (GAA), tri-gate, Pi-gate, and the like. Gate materials can surround the respective channel structures on all sides in the GAA configuration.

Referring to FIGS. 3A-3C and 3F, the first channel structure 373 can include portions 373(3)-(5) that can be covered or, surrounded by the first, second, and third terminal structures 391-393, respectively. The second channel structure 375 can include portions 375(3)-(5) that can be covered or surrounded by the first, second, and third terminal structures 391-393, respectively. In some examples, one or more of the portions 373(3)-(5) and 375(3)-(5) are removed from the 3D semiconductor apparatus 399.

Figure 3I:
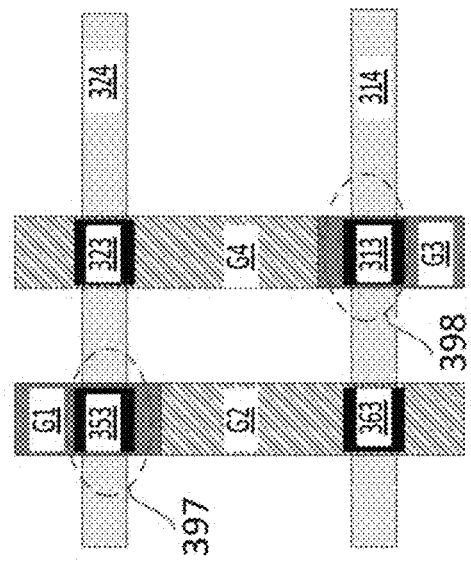
FIG. 3I shows a combined top view of the first portion and the second portion of the 3D semiconductor apparatus 399 according to an embodiment of the present disclosure.
Figure 3G:
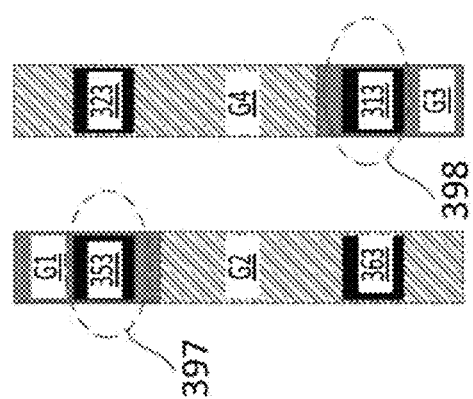
FIG. 3G shows a top view of a first portion of the 3D semiconductor apparatus 399 according to an embodiment of the present disclosure.

FIG. 3G shows a top, view of a first portion of the 3D semiconductor apparatus 399 according to embodiments of the present disclosure. G2 is stacked over G1, and the split gates G1-G2 are staggered. The first conductive trace 353 is connected to G1 at the portion 397 that is exposed (e.g., not covered by the upper gate G2). In an example, the first conductive trace 353 bypasses G2 and N1. The second conductive trace 363 is connected to G2, G4 is stacked over G3, and the split gates G3-G4 are staggered. The third conductive trace 313 is connected to G3 at the portion 398 that is exposed (e.g., not covered by the upper gate G4), In an example, the third conductive trace 313 bypasses N2 and G4. The fourth conductive trace 323 is connected to G4.

Figure 3H:
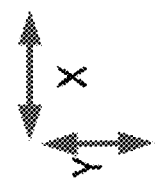
FIG. 3H shows a top view of a second portion of the 3D semiconductor apparatus 399 according to an embodiment of the present disclosure.
Figure 3H:
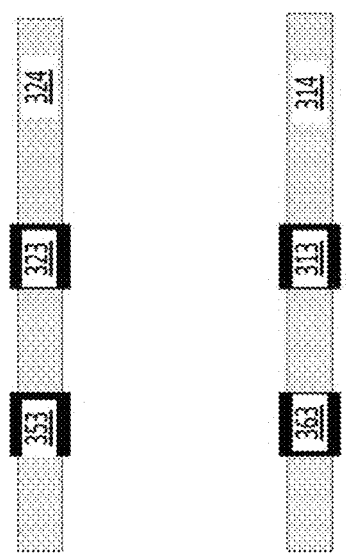

FIG. 3H shows a top view of a second portion of the 3D semiconductor apparatus 399 where the first routing track 324 is conductively connected to the first conductive trace 353 and the fourth conductive trace 323, and the second routing track 314 is conductively connected to the second conductive trace 363 and the third conductive trace 313. FIG. 3I shows a combined top view of the first portion and the second portion, and thus detailed descriptions are omitted for purposes of brevity. The first and second routing tracks 324 and 314 can be formed above the gates G1-G4.

Referring back to FIGS. 2A and 3A of the present disclosure, in the 2D semiconductor apparatus 299, a bidirectional structure (e.g., the conductive structure 214) is used to conductively couple the gates G1 and G4. However, in the 3D semiconductor apparatus 399, the first conductive trace 353 and the fourth conductive trace 323 can be configured to conductively couple the gates G1 and G4 to the first routing track 324, respectively, where the first routing track 324 is a unidirectional structure (e.g., parallel to the X direction). Thus, when the gates G1 and G4 of a pFET (e.g., P1) and an nFET (e.g., N2) are formed in different planes (e.g., the substrate plane 305 and the plane 307), respectively, the gates G1 and G4 can share or access a same routing track (e.g., the first routing track 341) that has a unidirectional shape, and thus alleviation the need for additional metallization, such as nFET to pFET crossing implemented by the conductive structure 214. Accordingly, usage of bidirectional structures can be eliminated or reduced in the 3D semiconductor apparatus 399 and routing congestion can be reduced since forming a unidirectional structure can be easier than forming a bidirectional structure.

Using bidirectional structures can increase an area of a semiconductor apparatus, and thus eliminating or reducing the bidirectional structures can reduce an area of the semiconductor apparatus. Further, stacking multiple transistors vertically along the Z direction (e.g., stacking P1 and N1 vertically and stacking P2 and N2 vertically as shown in FIGS. 3A, 3B, 3D, and 3E) can reduce an area of a semiconductor apparatus. Comparing FIGS. 2A and 3C, a 2D area of the XC 210 in FIG. 2A covers a width of 2 poly pitch (e.g., 2 cpp) along the X direction and a—height of at least 8 T along the Y direction. The height can be dh as described above. In contrast, a 3D area of the XC 310 in FIG. 3C covers a width of 2 poly pitch (e.g., 2 cpp) along the X direction and a height of 5 T along the Y direction. Thus, a transistor density in the 3D semiconductor apparatus 399 can be higher than a transistor density in tire 2D semiconductor apparatus 299.

Referring to FIGS. 2B, 2C, and 3C, a linear dimension (e.g., a sum of d1-d3) of the conductive structure 213 along the X and Y directions and a linear dimension (e.g., a sum of d4-d6) of the conductive structure 214 can be longer than a linear dimension d7 of the first and second routing tracks 324 and 314 along the X direction, and thus parasitic capacitances and/or resistances of each of the conductive structures 213-214 can be larger than those of each of the first and second routing tracks 324 and 314. Accordingly, performance of the XC 310 can be better than that of the XC 210.

Figure 3L:
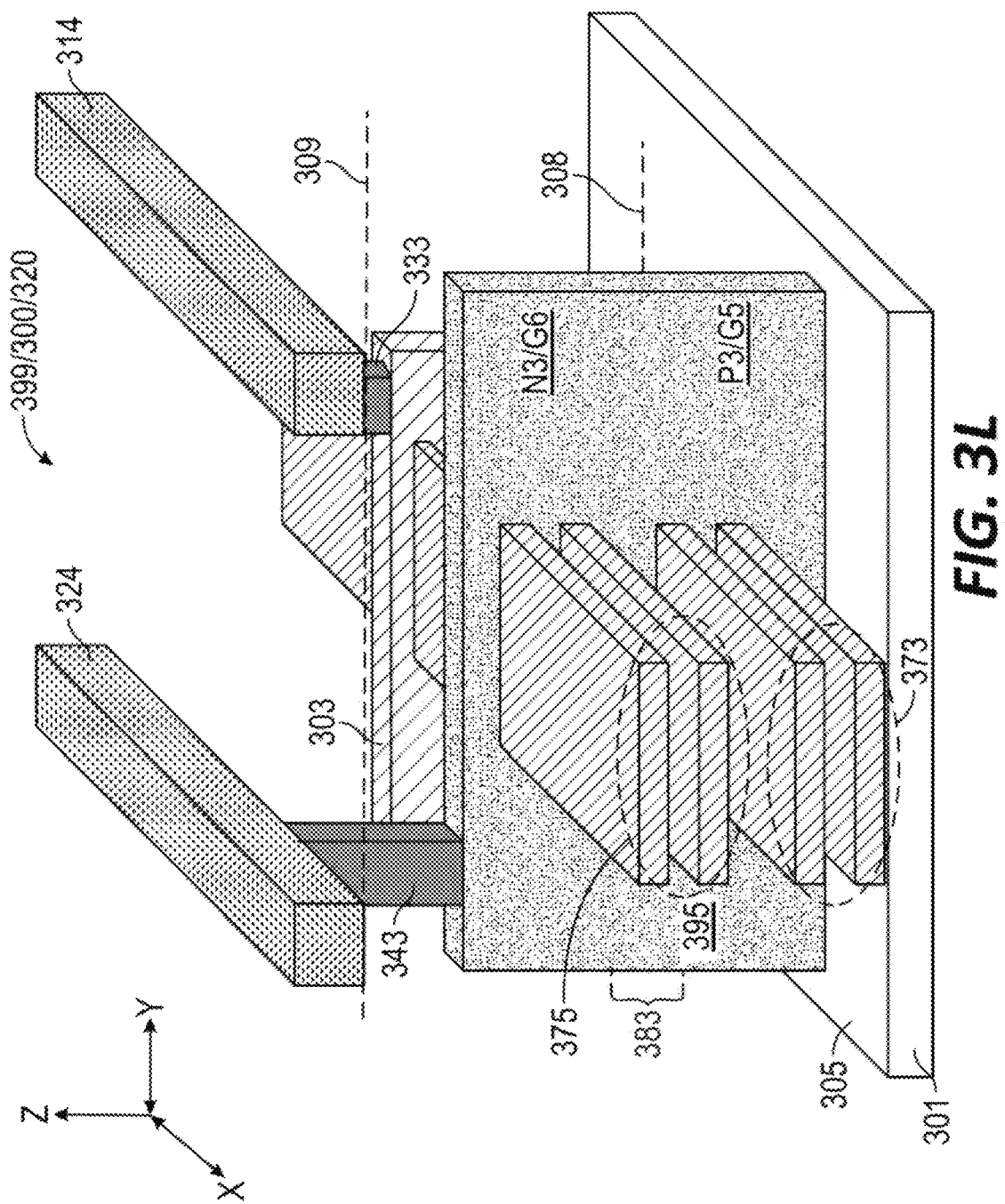
FIG. 3L shows a perspective view of the 3D semiconductor apparatus 399 including an inverter 320 according to an embodiment of the present disclosure.

FIG. 3L shows the 3D semiconductor apparatus 399 where the MUX 300 further includes an inverter 320 that implements the inverter 120. For purposes of clarity, various components in the XC 310 described with reference to FIGS. 3A-3I are omitted while components including the substrate 301, the first and second channel structures 373 and 375, the first and second routing tracks 324 and 314 are shown in FIG. 3L. The inverter 320 can include a third stack of transistors 383 having a transistor P3 formed on the substrate 301, such as on the substrate plane 305, and a transistor N3 stacked on P3 along the Z direction. N3 can be formed on a plane 308. Referring to FIGS. 1A and 3L, P3 includes the gate G5, the terminal T9, and the terminal T10, and N3 includes the gate G6, the terminal T11, and the terminal T12 where the gates G5-G6 can be conductively coupled to form a common gate 395. In an example shown in FIG. 3L, the gates G5-G6 are physically connected. A fifth conductive trace 343 can be configured to conductively couple the common gate 395 to one of: the first and second routing tracks 324 and 314. In an example, the fifth conductive trace 343 is configured to couple the common gate 395 to the first routing track 324, and thus the common gate 395 can be coupled to 'sel'. P3 can further include a portion of the first channel structure 373. When P3 is in operation, the portion of first channel structure 373 can provide a semiconductor channel, such as a p-channel, for P3. N3 can further include a portion of the second channel structure 375. When N3 is in operation, the portion of the second channel structure 375 can provide a semiconductor channel, such as an n-channel, for N3.

The third stack 383 can be positioned in any suitable location in the 3D semiconductor apparatus 399 with respect to the XC 310. For example, the third stack 383 can be located outside the XC 310 and are parallel to the first stack 381 and the second stack 382. Alternately, the third stack 383 can be located inside the XC 310.

The terminals T10-T11 can be coupled together as a terminal structure 303 and a conductive trace 333 can be configured to conductively couple the terminals T10-T11 or the terminal structure 303 to the second routing track 314 where the terminals T10-T11 can output the output signal (e.g., '!sel') of the inverter 320.

The 3D semiconductor apparatus 399 can include one or more cells, such as logic cells that can implement one or more logic functions, memory cells, and or the like. In an example, the 3D semiconductor apparatus 399 includes a cell where the XC 310 is in the cell. Further, the cell can include the inverter 320, and thus the MUX 300 is in the cell.

Figure 4:
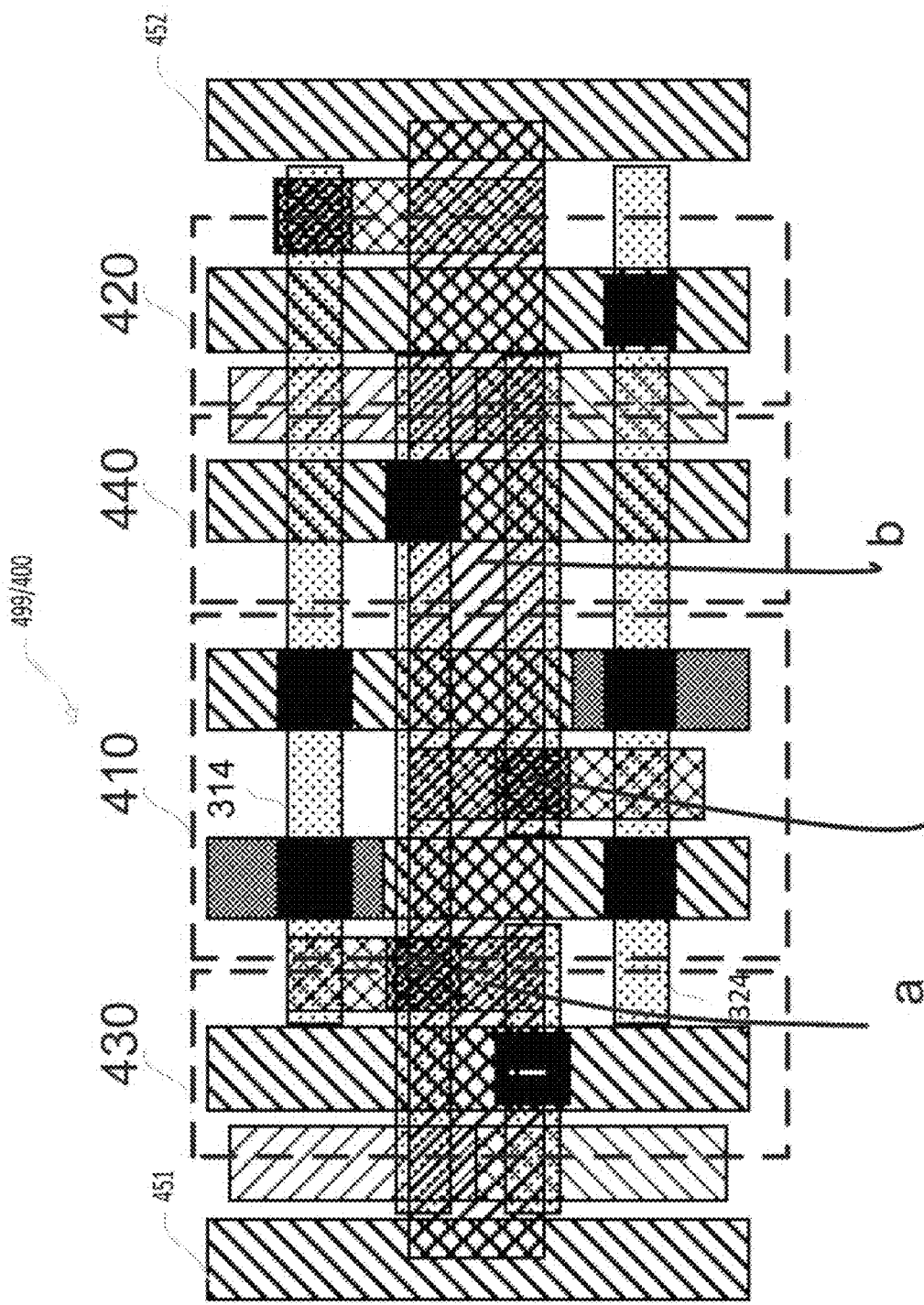
FIG. 4 illustrates a top view of an exemplary 3D semiconductor apparatus 499 according to an embodiment of the disclosure.

FIG. 4 illustrates a top view of an exemplary 3D semiconductor apparatus 499 using the disclosed XC 310 for a CFET-based logic design according to an embodiment of the disclosure. The 3D semiconductor apparatus 499 can include a MUX 400 that further has a XC 410 and an inverter 420. In an example, the MUX 400 can include identical or similar components as those of the MUX 300, the XC 410 can include identical or similar components as those of the XC 310, and the inverter 420 can include identical or similar components as those of the inverter 320, and thus detailed descriptions of the MUX 400, the XC 410, and the inverter 420 are omitted for purposes of brevity.

In an example, the MUX 400 further includes an inverter 430 that is configured to invert a signal 'i' on an input pin of the inverter 430 to generate the signal 'a' (i.e., 'a'='!i'). The signal 'a' becomes a first input into the XC 410. Further, the MUX 400 includes an inverter 440 that is configured to invert the signal 'a' into the signal 'b' which becomes a second input into the XC 410 where the signals 'a' and 'b' are inverted from each other, effectively making the signal 'b' a double inversion of the original input signal 'i'. The MUX 400 can also include dummy gates 451-452 that, for example, can electrically isolate the MUX 400 from adjacent cells or multiplexers.

The embodiments in the present disclosure axe described with certain details, such as a particular geometry, a circuit schematic, and/or the like. It should be understood, however, that techniques herein may be practiced in other embodiments that depart from these specific details, and that such details are for purposes of explanation and not limitation. In general, the embodiments can be applicable in thrilling a transmission gate pair including a first transmission gate and a second transmission gate. The first transmission gate can be controlled by a pair of signals (e.g., a pair of inverted signals) that are inverted from each other. The second transmission gate can also be controlled by the pair of inverted signals. Further, each one of the pair of inverted signals can control two transistors where one of the two transistors is in the first transmission gate (corresponding to a first signal path) and another one of the two transistors is in the second transmission gate (corresponding to a second signal path).

As described above, split gate structures and manufacturing processes can be used to form a first pair of split gates in the first transmission gate. Similarly, a second pair of split gates can be formed in the second transmission gate. Thus, a transistor density and the performance of the transmission gate pair can be improved. Further, the complexity of forming bidirectional structures can be reduced or eliminated by using split gates structures, and a layout or design for the transmission gate pair can be simplified.

Each of the first transmission gate and the second transmission gate can include complementary transistors. The complementary transistors can have any suitable arrangement. For example, an n-type transistor can be stacked above a p-type transistor. Alternatively, the p-type transistor can be stacked above the n-type transistor. When the complementary transistors are CFETs. The CFETs can have any suitable arrangement. For example, an nFET can be stacked above a pFET. Alternatively, the pFET can be stacked above the nFET. The embodiments described above can be suitably adapted to the above situations.

In addition to stacking complementary transistors, multiple p-type transistors can be stacked. Similarly, multiple n-type transistors can be stacked. Similarly, multiple pFETs can be stacked, and multiple nFETs can be stacked. The embodiments described above can be suitably adapted to the above situations.

The 3D semiconductor apparatuses 399 and 499, the MUX 300 and 400, and the XCs 310 and 410 in the present disclosure can be manufactured using any suitable structures, components, material systems, dimensions, and manufacturing processes, such as disclosed in U.S. patent application Ser. No. 16/206,513 filed on Nov. 30, 2018 and titled "Semiconductor apparatus having stacked gates and, method of manufacture thereof" which is incorporated herein by reference in its entirety. For example, the first stack 381 (including the split gates G1-G2 and the dielectric layer 371) and the second stack 382 (including the split gates G3-G4 and the dielectric layer 371) can have similar or identical structure and material systems as those in U.S. patent application Ser. No. 16/206,513.

The embodiments can be suitably adapted to a 3D semiconductor apparatus that can include additional 3D devices, such as a stacked SRAM as well as for other transistor types.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to, the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus arty redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to, any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A semiconductor apparatus, comprising:
a first stack of transistors including a first transistor formed on a substrate and a second transistor stacked on the first transistor along a Z direction substantially perpendicular to a substrate plane of the substrate;
a second stack of transistors including a third transistor formed on the substrate and a fourth transistor stacked on the third transistor along the Z direction;
a first routing track and a second routing track electrically isolated from the first routing track, the first routing track and the second routing track being positioned in a plane above the first stack of transistors and the second stack of transistors along the Z direction, the first routing track and the second routing track extending in an X direction parallel to the substrate plane;
a first conductive trace and a fourth conductive trace configured to conductively couple a first gate of the first transistor and a fourth gate of the fourth transistor to the first routing track, respectively, the first routing track being connected to the first conductive trace that is configured to conductively couple the first gate of the first transistor in the first stack of transistors and the fourth conductive trace that is configured to conductively couple the fourth gate of the fourth transistor in the second stack of transistors, the first conductive trace having a first height along the Z direction and the fourth conductive trace having a fourth height along the Z direction, the fourth height being less than the first height;
a second conductive trace and a third conductive trace configured to conductively couple a second gate of the second transistor and a third gate of the third transistor to the second routing track, respectively, the second routing track being connected to the second conductive trace that is configured to conductively couple the second gate of the second transistor in the first stack of transistors and the third conductive trace that is configured to conductively couple the third gate of the third transistor in the second stack of transistors, the second conductive trace having a second height along the Z direction and the third conductive trace having a third height along the Z direction, the second height being less than the third height; and
a first terminal structure configured to conductively couple four source/drain (S/D) terminals of the first, second, third and fourth transistors, respectively,
wherein the first conductive trace and the third conductive trace are spaced apart from each other both in the X direction and in the Y direction, which is perpendicular to the X direction and parallel to the substrate plane.

2. The semiconductor apparatus of claim 1, further comprising:
a second terminal structure configured to conductively couple remaining S/D terminals of the first and second transistors.

3. The semiconductor apparatus of claim 1, further comprising:
a third terminal structure configured to conductively couple remaining S/D terminals of the third and fourth transistors.

4. The semiconductor apparatus of claim 1, further comprising:
an inverter circuit configured to invert an input signal of the inverter circuit into an output signal of the inverter circuit, the output signal being an inverted signal of the input signal.

5. The semiconductor apparatus of claim 4, wherein the inverter circuit comprises:
a third stack of transistors including a fifth transistor formed on the substrate and a sixth transistor stacked on the fifth transistor along the Z direction; and
a fifth conductive trace configured to conductively couple a common gate to one of: the first and second routing tracks, the common gate including a fifth gate of the fifth transistor and a sixth gate of the sixth transistor that are conductively coupled to the input signal.

6. The semiconductor apparatus of claim 4, further comprising:
a conductive trace configured to conductively couple the input signal to the first routing track; and
a conductive trace configured to conductively couple the output signal to the second routing track.

7. The semiconductor apparatus of claim 1, further comprising:
a conductive trace configured to conductively couple a first signal to the first routing track; and
a conductive trace configured to conductively couple a second signal to the second routing track, the second signal being an inverted signal of the first signal.

8. The semiconductor apparatus of claim 1, wherein the second gate of the second transistor is stacked directly above the first gate of the first transistor along the Z direction, and the fourth gate of the fourth transistor is stacked directly above the third gate of the third transistor along the Z direction.

9. The semiconductor apparatus of claim 1, wherein the first conductive trace bypasses the second gate of the second transistor and the second transistor, and the third conductive trace bypasses the fourth gate of the fourth transistor and the fourth transistor.

10. The semiconductor apparatus of claim 1, wherein the first and the second transistors are complementary transistors including an n-type transistor and a p-type transistor, and the third and the fourth transistors are complementary transistors.

11. The semiconductor apparatus of claim 5, wherein
the second gate of the second transistor is stacked on the first gate of the first transistor and the fourth gate of the fourth transistor is stacked on the third gate of the third transistor, the first routing track and the second routing track are positioned in one or more planes above the first, second, third, and fourth gates along the Z direction, the first conductive trace and the second conductive trace are spatially separated, the one or more planes include the plane above the first stack of transistors and the second stack of transistors, the first conductive trace bypasses the second gate of the second transistor and the second transistor, and the second conductive trace bypasses the first gate of the first transistor and the first transistor, the third and fourth conductive trace are spatially separated, the third conductive trace bypasses the fourth gate of the fourth transistor and the fourth transistor, the fourth conductive trace bypasses the third gate of the third transistor and the third transistor, and the fifth conductive trace is conductively coupled to the first routing track; and the semiconductor apparatus further includes a conductive trace configured to couple the output signal to the second routing track.

12. The semiconductor apparatus of claim 1, wherein a second gate area that is a maximum cross sectional area of the second gate intersecting with a plane substantially perpendicular to the Z direction is equal to or larger than a first gate area that is a maximum cross sectional area of the first gate intersecting with a plane substantially perpendicular to the Z direction, and a fourth gate area that is a maximum cross sectional area of the fourth gate intersecting with a plane substantially perpendicular to the Z direction is equal to or larger than a third gate area that is a maximum cross sectional area of the third gate intersecting with a plane substantially perpendicular to the Z direction, the second gate is staggered above the first gate, and the fourth gate is staggered above the third gate.

13. The semiconductor apparatus of claim 1, wherein a second gate area that is a maximum cross sectional area of the second gate intersecting with a plane substantially perpendicular to the Z direction is less than a first gate area that is a maximum cross sectional area of the first gate intersecting with a plane substantially perpendicular to the Z direction, and a fourth gate area that is a maximum cross sectional area of the fourth gate intersecting with a plane substantially perpendicular to the Z direction is less than a third gate area that is a maximum cross sectional area of the third gate intersecting with a plane substantially perpendicular to the Z direction, the second gate is staggered above the first gate, and the fourth gate is staggered above the third gate.

14. The semiconductor apparatus of claim 1, wherein the first transistor further includes a first set of semiconductor bars stacked along the Z direction in which the first gate of the first transistor surrounds and is attached to the first set of semiconductor bars, and the second transistor further includes a second set of semiconductor bars stacked along the Z direction in which the second gate of the second transistor surrounds and is attached to the second set of semiconductor bars.

15. The semiconductor apparatus of claim 14, wherein the second set of semiconductor bars is stacked on the first set of semiconductors bars along the Z direction.

16. The semiconductor apparatus of claim 1, wherein the first gate and the second gate are separated and conductively isolated by a dielectric layer including one or more dielectric materials, and the third gate and the fourth gate are separated and conductively isolated by the dielectric layer.

17. The semiconductor apparatus of claim 1,
wherein the first height and the third height are both greater than the second height and the fourth height.

* * * * *